United States Patent
Chung et al.

(10) Patent No.: US 7,541,804 B2
(45) Date of Patent: Jun. 2, 2009

(54) MAGNETIC TUNNEL JUNCTION SENSOR

(75) Inventors: Young Sir Chung, Chandler, AZ (US); Robert W. Baird, Gilbert, AZ (US); Bradley N. Engel, Chandler, AZ (US)

(73) Assignee: EverSpin Technologies, Inc., Chandler, AZ (US)

( * ) Notice: Subject to any disclaimer, the term of this patent is extended or adjusted under 35 U.S.C. 154(b) by 529 days.

(21) Appl. No.: 11/192,569

(22) Filed: Jul. 29, 2005

(65) Prior Publication Data

US 2007/0025027 A1     Feb. 1, 2007

(51) Int. Cl.
*G01R 33/02* (2006.01)
(52) U.S. Cl. ...................................... 324/244
(58) Field of Classification Search ............. 324/117 H, 324/117 R, 207.12–207.25, 244–252, 259–263
See application file for complete search history.

(56) References Cited

U.S. PATENT DOCUMENTS

| | | | |
|---|---|---|---|
| 6,185,079 B1 * | 2/2001 | Gill | 360/324.2 |
| 6,555,858 B1 * | 4/2003 | Jones et al. | 257/295 |
| 6,707,298 B2 * | 3/2004 | Suzuki et al. | 324/252 |
| 6,714,442 B1 | 3/2004 | Nahas | |
| 6,897,650 B2 * | 5/2005 | Black et al. | 324/252 |
| 6,906,511 B2 * | 6/2005 | Chaparala | 324/207.13 |
| 2002/0011841 A1 | 1/2002 | Goto et al. | |
| 2005/0029436 A1 | 2/2005 | McElfresh et al. | |
| 2007/0063690 A1 * | 3/2007 | De Wilde et al. | 324/117 R |
| 2007/0182407 A1 * | 8/2007 | Sato et al. | 324/252 |

FOREIGN PATENT DOCUMENTS

WO    WO 2005/064356 A2    7/2005

OTHER PUBLICATIONS

Li et al. "MEMS Microbridge Vibration Monitoring Using Spin-Valve Sensors," IEEE Transactions on Magnetics, vol. 38, issue 5, pp. 3371-3372, 2002.
Papautsky et al., "A Low-Temperature IC-Compatible Process for Fabricating Surface-Micromachined Metallic Microchannels,". J. of MEMS, vol. 7, No. 2, pp. 267-273, 1998.

* cited by examiner

*Primary Examiner*—Jay M Patidar
(74) *Attorney, Agent, or Firm*—Ingrassia, Fisher & Lorenz, P.C.

(57) ABSTRACT

Methods and apparatus are provided for sensing physical parameters. The apparatus comprises a magnetic tunnel junction (MTJ) and a magnetic field source whose magnetic field overlaps the MTJ and whose proximity to the MTJ varies in response to an input to the sensor. The MTJ comprises first and second magnetic electrodes separated by a dielectric configured to permit significant tunneling conduction therebetween. The first magnetic electrode has its spin axis pinned and the second magnetic electrode has its spin axis free. The magnetic field source is oriented closer to the second magnetic electrode than the first magnetic electrode. The overall sensor dynamic range is extended by providing multiple electrically coupled sensors receiving the same input but with different individual response curves and desirably but not essentially formed on the same substrate.

16 Claims, 10 Drawing Sheets

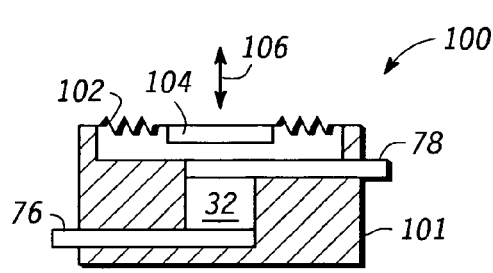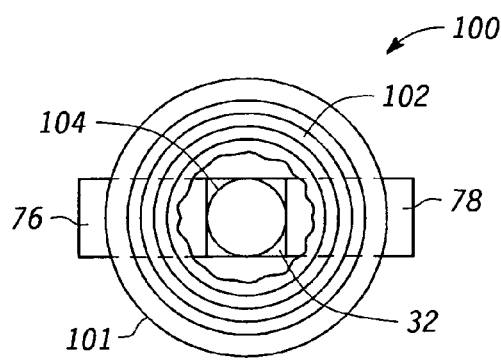
FIG. 11   FIG. 12
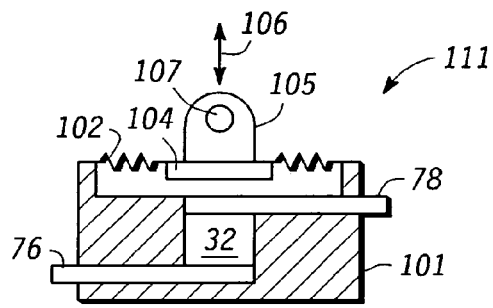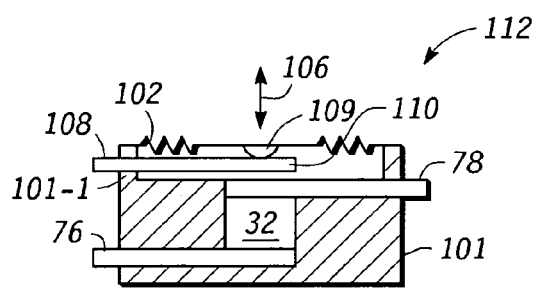
FIG. 13   FIG. 14
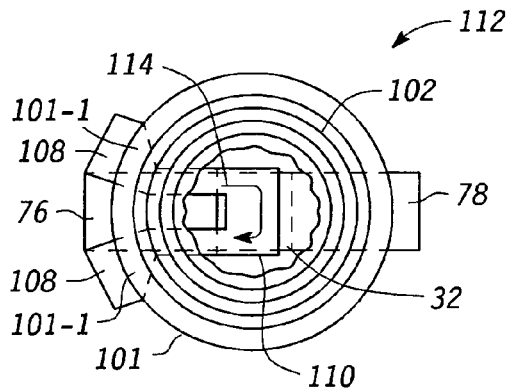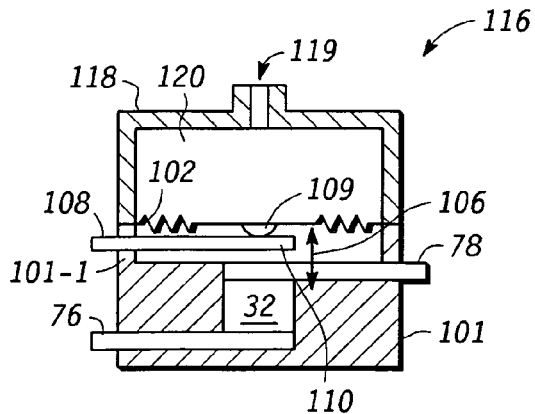
FIG. 15   FIG. 16 ions (MTJ).
MAGNETIC TUNNEL JUNCTION SENSOR

TECHNICAL FIELD

The present invention generally relates to sensing, and more particularly to sensors employing magnetic tunnel junctions (MTJ).

BACKGROUND

Sensors are widely used in modern systems to measure or detect physical parameters such as, and not intended to be limiting, position, motion, force, acceleration, temperature, pressure and so forth. Many different types of sensors exist in the prior art for measuring these and other parameters. However, they all suffer from various limitations well known in the art, for example, excessive size and weight, inadequate sensitivity and/or dynamic range, cost, reliability and other factors. Thus, there continues to be a need for improved sensors, especially sensors that can be easily integrated with semiconductor devices and integrated circuits and manufacturing methods therefore.

Accordingly, it is desirable to provide an improved sensor and method, adaptable for measuring various physical parameters. In addition, it is desirable that the sensor and method be simple, rugged and reliable, and further, be compatible with semiconductor device and integrated circuit structures and fabrication methods, and preferably but not essentially adapted to be formed on the same substrate. It is further desirable that the improved sensor and method convert the physical parameter being measured into an electrical signal. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The invention will hereinafter be described in conjunction with the following drawing figures, wherein like numerals denote like elements.

FIG. 11 is a simplified schematic cross-sectional view through a magnetic tunnel junction sensor according to a further exemplary embodiment of the invention;

FIG. 12 is a simplified partially cut-away plan view of the sensor of FIG. 11;

FIG. 13 is a simplified schematic cross-sectional view similar to that of FIG. 11 but according to a still further exemplary embodiment of the invention;

FIG. 14 is a simplified schematic cross-sectional view analogous to that of FIG. 11 but according to a yet further exemplary embodiment of the invention and employing an active magnetic field source;

FIG. 15 is a simplified partially cut-away plan view of the sensor of FIG. 14 showing further details;

FIG. 16 is a simplified schematic cross-sectional view analogous to that of FIG. 14 but according to a still further exemplary embodiment of the invention, adapted to measure temperature or pressure;

DETAILED DESCRIPTION

Figure 1:
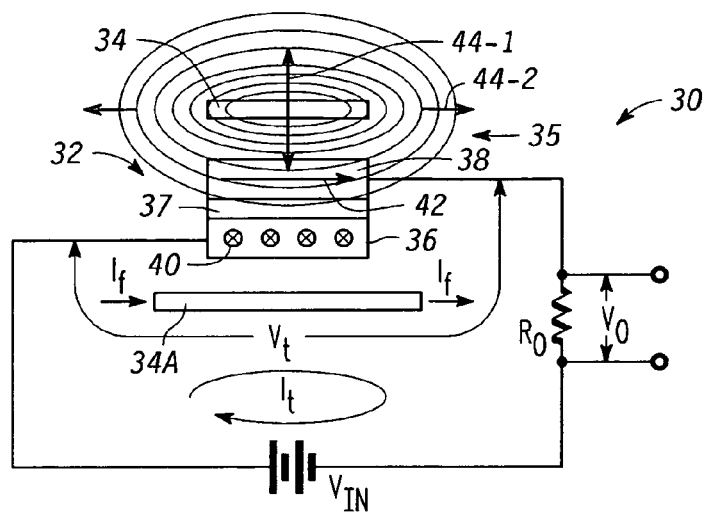
FIG. 1 is a simplified schematic side view and electrical circuit of a sensor employing a magnetic tunnel junction (MTJ), according to an exemplary embodiment of the invention.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," right," "in," "out," "front," "back," "up," "down, "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

FIG. 1 is a simplified schematic side view and electrical circuit of sensor 30 employing magnetic tunnel junction (MTJ) 32 and moveable magnetic field source (MFS) 34, according to an exemplary embodiment of the invention. Magnetic field source (MFS) 34 is free to move as indicated by arrows 44-1, 44-2 (collectively 44) and provides magnetic field 35 that moves with respect to MTJ 32, thereby changing the intensity and/or direction of the magnetic field H at MTJ 32 depending upon the relative position of MFS 34 and MTJ 32. MTJ 32 comprises first electrode 36, insulating tunneling dielectric 37 and second electrode 38. When voltage $V_t$ is applied across MTJ 32, current $I_t$ flows by quantum mechanical tunneling through insulator 37 from electrode 36 to electrode 38 or vice versa depending upon the polarity of the applied voltage.

Electrodes 36, 38 are desirably magnetic materials, for example, and not intended to be limiting, NiFe, CoFe, and the like, or more generally, materials whose electronic spin axes can be collectively aligned. Examples of suitable electrode materials and arrangements are the materials and structures commonly used for electrodes of magnetoresistive random access memory (MRAM) devices, which are well known in the art and contain, among other things, ferromagnetic materials. It is desirable that electrodes 36, 38 have different coercive force, that is, electrode 36 should have a high coercive force so that its spin axes orientation can be pinned so as to be substantially unaffected by movement of MFS 34, and electrode 38 should have a comparatively low coercive force so that its spin axes orientation are altered by movement of MFS 34. It is desirable that the coercive force of electrode 36 is about two orders of magnitude larger than that of electrode 38, but bigger and smaller ratios are also useful. The coercive force of the electrodes can be adjusted by varying their composition according to means well known in the art. Exemplary spin axes alignments are indicated in FIG. 1 wherein vectors 40 (hereafter spin axes 40) of electrode 36 indicate that the electron spin axes in electrode 36 are aligned perpendicular to and facing into the plane of the drawings of FIG. 1, and vector 42 (hereafter spin axes 42) of electrode 38 indicates that the electron spin axes in electrode 38 are aligned parallel to the plane of the drawing and facing to the right in FIG. 1, that is, orthogonal to spin axes 40. It is known in the art that the spin axis orientation can be pinned in one direction or another by appropriate heat treatment in the presence of a magnetic field and by other means. The spin axes in lower electrode 36, that is, in the electrode furthest from magnetic field source 34 are desirably pinned. The spin axes may be pinned in any convenient direction depending, for example, on the magnetic field direction of source 34. Spin axes 42 in upper (closest to MFS 34) electrode 38 are free, that is, not pinned and change orientation with respect to pinned spin axes 40 in electrode 36 in response to magnetic field 35 provided by MFS 34. Magnetic field source conductor 34A is conveniently provided proximate MTJ 32 but on the side opposite MFS 34 and oriented so as to be at right angles to MFS 34 in terms of its magnetic field. Current $I_f$ is conveniently provided in MFS conductor 34A in order to assist in flipping spin axes 42 to other directions than may be possible with MFS 34 alone, or to restore spin axes 42 to a previous state after being flipped by proximity to MFS 34.

Figure 2:
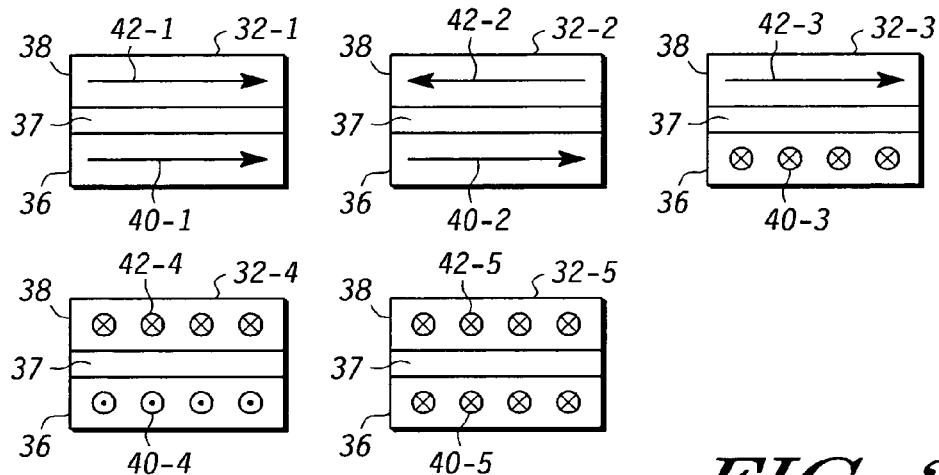
FIG. 2 is collection of side views of the magnetic tunnel junction of FIG. 1 illustrating different orientations of the magnetic spin axes therein.

FIG. 2 is collection of side views of magnetic tunnel junction (MTJ) 32 of FIG. 1, that is, of MTJs 32-1 . . . 32-5, illustrating different relative orientations of magnetic spin axes 40, 42 in electrodes 36, 38. In MTJ 32-1, free spin axes 42-1 and pinned spin axes 40-1 are parallel, lying in the plane of the drawing of FIG. 2 and both facing to the right. In MTJ 32-2 free spin axes 42-2 and pinned spin axes 40-2 are parallel and lying in the plane of the drawing but facing in opposite (anti-parallel) directions, axes 42-2 facing left and axes 40-2 facing right. In MTJ 32-3, the spin axes are orthogonal, free spin axes 42-3 in electrode 38 lying in the plane of the drawings and facing right and pinned spin axes 40-3 of electrode 36 facing perpendicular to and into the plane of the drawing. In MTJ 32-4, the spin axes are anti-parallel, spin axes 42-4 facing into the plane of the drawing and spin axes 40-4 facing out of the plane of the drawing. In MTJ 32-5, spin axes 42-5 and 40-5 are parallel, perpendicular to and facing into the plane of the drawing. The examples of FIG. 2 are not meant to be exhaustive, but to merely illustrate that various relative spin axes orientations are possible. Other relative orientations are also possible.

Figure 3:
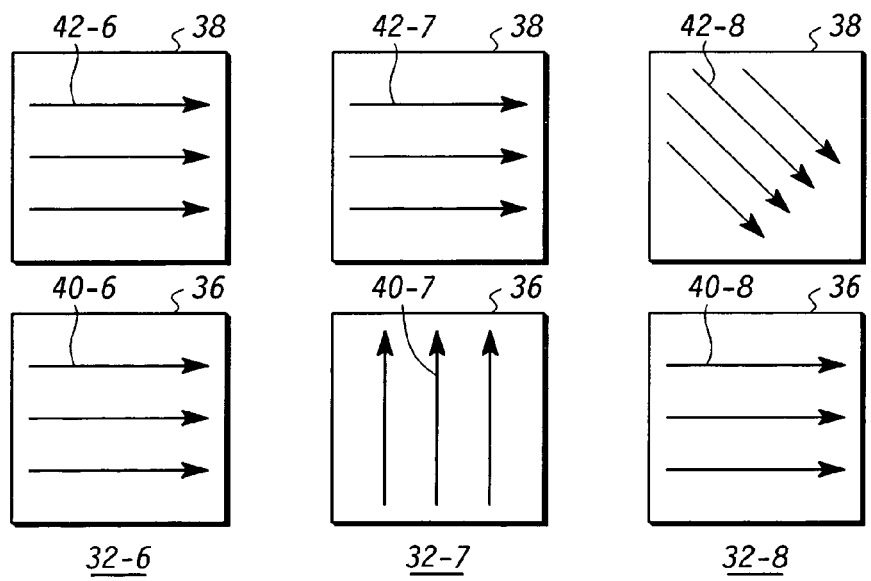
FIG. 3 is collection of exploded plan views of the magnetic tunnel junction of FIG. 1 illustrating different orientations of the magnetic spin axes therein.

FIG. 3 is collection of exploded plan views 32-6, 32-7, 32-8 of magnetic tunnel junction 32 of FIG. 1 illustrating different orientations of the magnetic spin axes therein, as seen perpendicular to the view of FIG. 2. While in FIGS. 1-2, electrode 38 lies above electrode 36 separated therefrom by tunneling dielectric 37, in FIG. 3 electrodes 36, 38 are displaced from such alignment so that the azimuthal orientation of the spin axes lying in the plane of electrodes 36, 38 may be more easily seen. For example, in MTJ 32-6 of FIG. 3 spin axes 42-6, and 40-6 have the same orientation as spin axes 42-1 and 40-1 of MTJ 32-1 of FIG. 2, and in MTJ 32-7 of FIG. 3, spin axes 42-7 and 40-7 have the same orientation as spin axes 42-3 and 40-3 of MTJ 32-3 of FIG. 2. However, MTJ 32-8 of FIG. 3 illustrates another possibility, that is, spin axes 42-8 have an azimuthal orientation that is neither parallel to nor orthogonal to spin axes 40-8, but lies at an intermediate azimuthal angle relative to spin axes 40-8. In the foregoing, it is presumed that electrodes 36, 38 are sufficiently thin that spin axes 40, 42 always lie in the planes of electrodes 36, 38, but may be oriented at different relative azimuthal angles in the planes of electrodes 36, 38.

Figure 4:
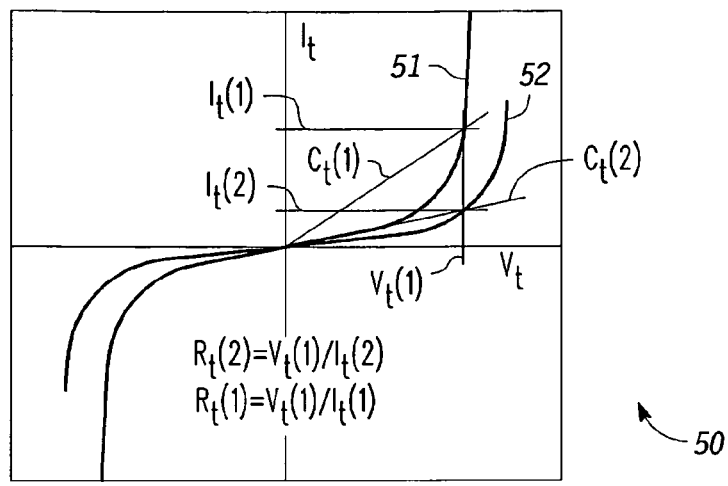
FIG. 4 is a simplified plot of current versus voltage of a magnetic tunnel junction for two different orientations of the magnetic spin axes.

The relative orientation of the spin axes in electrode 36 and 38 affects the electrical properties of MTJ 32. This is because, the spin orientation affects the density of electron states near the Fermi level where most tunneling occurs and therefore affects the tunneling probability for the same applied electric field or applied voltage at constant barrier thickness. FIG. 4 shows representative current versus voltage plot 50 of magnetic tunnel junction 32 for two different orientations of the magnetic spin axes 40, 42. Trace 51 corresponds to the case where spin axes 40, 42 are parallel and trace 52 corresponds to the case where spin axes 40, 42 are anti-parallel. For a given voltage $V_t=V_t(1)$ across MTJ 32, MTJ 32 has conductance $C_t(1)$ when the $I_t$ vs $V_t$ characteristic correspond to trace 51 and different conductance $C_t(2)$ when $I_t$ vs $V_t$ characteristic corresponds to trace 52. Stated another way, when MTJ 32 is in the state characterized by trace 51, then for $V_t=V_t(1)$, $I_t=I_t(1)$ and when MTJ 32 is in the state characterized by trace 52, for the same voltage $V_t=V_t(1)$, then $I_t=I_t(2)<I_t(1)$. This difference in conductance $C_t$ or resistance $R_t$ or current $I_t$ at constant voltage may be used to detect changes in the relative orientation of spin axes 40, 42 in electrodes 36, 38. Because the spin axes orientation in electrode 38 depends upon the applied magnetic field H (e.g., see FIG. 1), the change in conductance or resistance or the change in current at constant voltage may be used to detect changes in H or changes in any physical parameter that can cause a variation in H. As illustrated in FIG. 1, changes in location or orientation of MFS 34 with respect to MTJ 32 (e.g., as illustrate by arrows 44-1 and 44-2) cause H at MTJ 32 to vary and therefore can cause the electrical properties of MTJ 32 to vary in a predictable way. As indicated on FIG. 4, the tunneling resistance $R_t$ for the two cases may be calculated from the relations $R_t(2)=V_t(1)/I_t(2)$ and $R_t(1)=V_t(1)/I_t(1)$.

Figure 5:
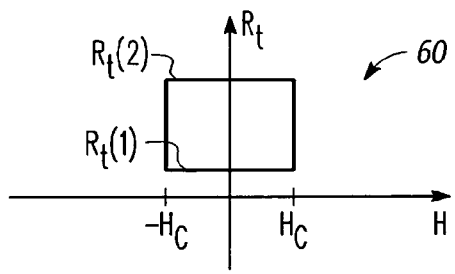
FIGS. 5-7 are simplified plots the resistance of a magnetic tunnel junction as a function of applied magnetic field.
Figure 6:
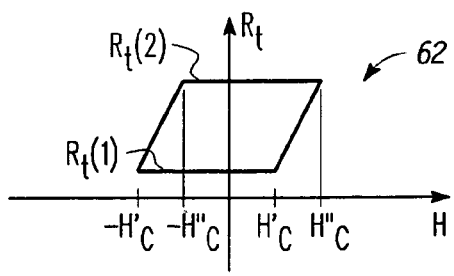
Figure 7:
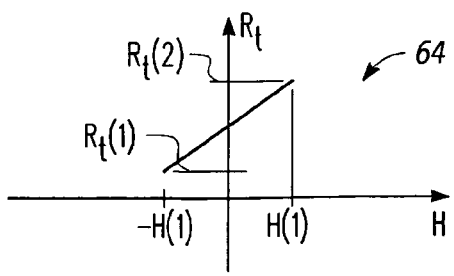

FIGS. 5-7 are simplified plots 60, 62, 64 of tunneling resistance $R_t$ of MTJ 32 as a function of applied magnetic field H. Plot 60 of FIG. 5 illustrates the case where electrode 38 switches like a single magnetic domain, that is, its spin axis 42 remains substantially unchanged until a critical field $H_c$ or $-H_c$ is reached, whereupon it substantially snaps or flips to a new orientation. For example, if MTJ 32 is in the state characterized by $R_t=R_t(1)$ at $V_t=V_t(1)$, it remains in this state until $H=H_c$ and then flips to the state characterized by $R_t=R_t(2)$. It remains in this state until $H=-H_c$ when it flips back. This type of hysteresis behavior is very useful when it is desired that sensor 20 has a binary output in response to changes in acceleration, force, temperature, position, pressure or whatever other physical parameter causes H to change, for example, by causing MFS 34 to move with respect to MTJ 32. Magnetic field $-H_c$ needed to flip back can be conveniently provided by current lead 34A shown in FIG. 1.

Plot 62 of FIG. 6 illustrates the case where electrode 38 exhibits what amounts to multiple magnetic domains, that can individually flip at slightly different magnetic fields $H_c' \leq H \leq H_c''$. Assuming for purposes of explanation that MTJ 32 is in the state characterized by $R_t=R_t(1)$, then as H is increased, $R_t$ remains unchanged until $H=H_c'$, whereupon $R_t$ begins to gradually increase at constant voltage until $H=H_c''$ whereupon $R_t$ locks at $R_t=R_t(2)$. Hysteresis loop 62 has a slanted parallelepiped shape. FIG. 7 shows the situation when the material and orientation of electrode 38 are such (e.g., at right angles to each other) that the magnetization can rotate continuously in response to an increase or decrease in H. Then the hysteresis loop essentially collapses into a nearly straight line as shown by $R_t$ vs H plot 64 with its two extremities at $R_t=R_t(1)$ and $R_t=R_t(2)$. This situation occurs when spin axes 42 can rotate continuously relative to spin axes 40, as shown for example in MTJ 32-8 of FIG. 3. Current line 34A shown in FIG. 1 is conveniently used in connection with the arrangements depicted by plots 60, 62 to provide magnetic field $-H_c$ so that spin axes 42 may be reset, that is, flipped back to its initial orientation before it was perturbed by magnetic field 35.

Figure 8:
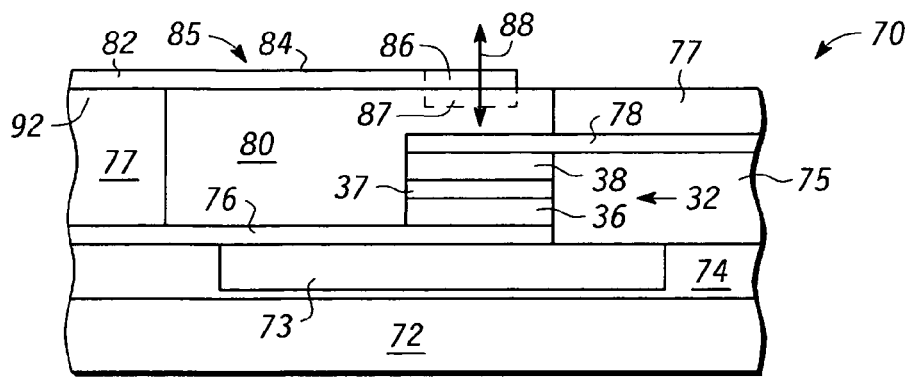
FIG. 8 is a simplified schematic side view of a magnetic tunnel junction sensor according to another exemplary embodiment of the invention employing a moveable cantilever beam supporting a magnetic field source whose position is dependent upon the sensor input.

FIG. 8 is simplified schematic side view of magnetic tunnel junction sensor 70 according to exemplary embodiments of the invention employing deflectable cantilever beam 84 with magnetic field source 86, whose position depends upon the input to sensor 70. MTJ sensor (MTJS) 70 comprises substrate 72, conveniently a semiconductor substrate on which MTJ device 32 and cantilever beam 84 with magnetic field source 86 are formed. Substrate 72 desirably has portion 74 wherein electronic circuitry 73 for measuring the change in electrical properties of MTJ 32 is provided, but this is not essential. When an active magnetic field source is employed (e.g., see FIG. 9), circuitry 73 may also include the current drivers for magnetic field source (MFS) portion 86, but this is not essential. Conductor 76 conveniently makes electrical contact to MTJ electrode 36 and conductor 78 makes electrical contact to MTJ electrode 38. Conductors 76, 78 are conveniently of Ta/TaN but this is not intended to be limiting, and any reasonably conductive material may be used. An insulating layer (not shown) may be provided between conductor 76 and portion 74. Although not shown to avoid unduly cluttering FIGS. 8-10, current line 34A of FIG. 1 may also be provided beneath MTJ 32, that is, between conductor 76 and region 74 of substrate 72, but this is not essential. Dielectric region 75 is provided to support electrode 78. Tunneling dielectric 37 is conveniently of aluminum oxide, although other highly insulating materials that can be fabricated in very thin, substantially uniform, pin-hole free layers may also be used, such as MgO. Dielectric planarization layer 77 is provided above conductors 76, 78. Region 82 of cantilever beam 84 is supported by region 92 of layer 77. Portions 85 and 86 of cantilevered beam 84 are free, that is, they may move as indicated by arrows 88. Magnetic field source (MFS) portion 86 of beam 84 lies above MTJ 32. Recess or opening 80 is provided in layer 77 to allow portion 85 and MFS portion 86 of cantilever beam 84 to deflect, for example, toward and away from MTJ 32, as indicated by arrows 88. As explained in connection with FIGS. 9 and 10, MFS 86 may be active, that is, current carrying (e.g., see FIGS. 8-9) or may be passive, that is, include permanent magnet 87 (e.g., see FIGS. 8, 10). Whatever physical parameter is desired to be measured by sensor 70, such physical parameter is coupled to cantilevered beam 84 so as to cause it to deflect as shown by arrows 88 in response to changes in such physical parameter.

Figure 9:
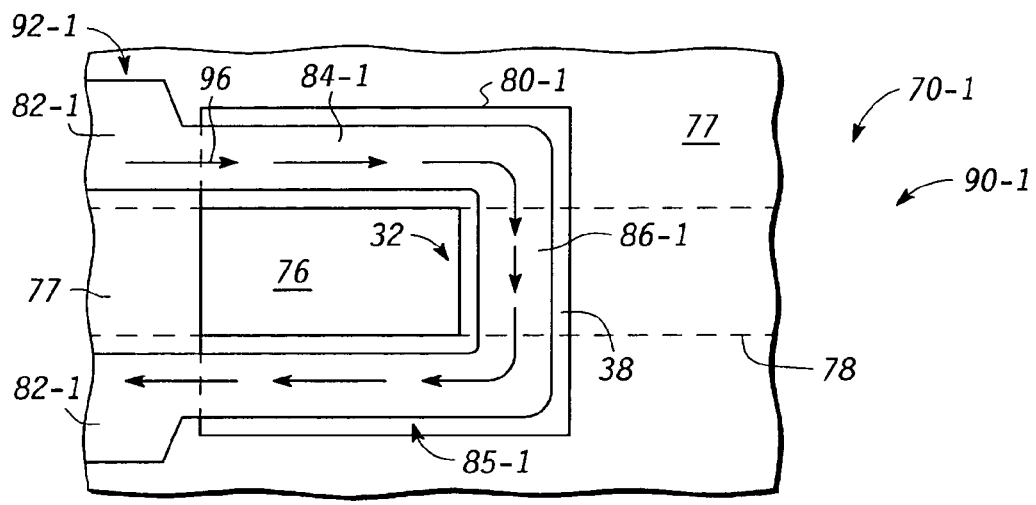
FIG. 9 is a simplified plan view of the magnetic tunnel junction sensor of FIG. 8 wherein a current carrying flexible U-shaped cantilevered beam provides a varying magnetic field to the magnetic tunnel junction, depending upon the sensor input.

FIG. 9 is simplified plan view 90-1 of magnetic tunnel junction sensor 70-1 corresponding to an exemplary embodiment of sensor 70 of FIG. 8, wherein cantilevered beam 84 has a U-shape, as may be seen in FIG. 9. Current carrying deflectable cantilevered beam 84-1 has MFS portion 86-1 that provides the varying magnetic field to magnetic tunnel junction (MTJ) 32. MTJ 32 is seen in plan view 90-1 with electrode 38 nearest to the viewer. U-shaped cantilever beam 84-1 has end regions 82-1 anchored on region 92-1 of layer 77 and portions 85-1 and 86-1 extending over recessed area or opening 80-1 in layer 77. MFS portion 86-1 forms the bottom of the "U" and overlies MTJ 32. Current 96 flows through U-shaped cantilever beam 84-1 including MFS portion 86-1 and produces a magnetic field in the vicinity of MTJ 32, analogous to magnetic field 35 of sensor 20 of FIG. 1. Such an arrangement is referred to as having an active magnetic field source (MFS), that is, the magnetic field is generated by a current rather than a permanent magnet. While cantilever beam 84-1 is illustrated as having straight, constant width leg portions of the "U" shape, such straight constant width leg portions ares merely for convenience of illustration and not intended to be limiting and persons of skill in the art will understand based on the description herein that any U-shape may be employed that is suitable for accommodating the desired current and providing the desired deflection characteristics in the direction of arrows 88.

Figure 10:
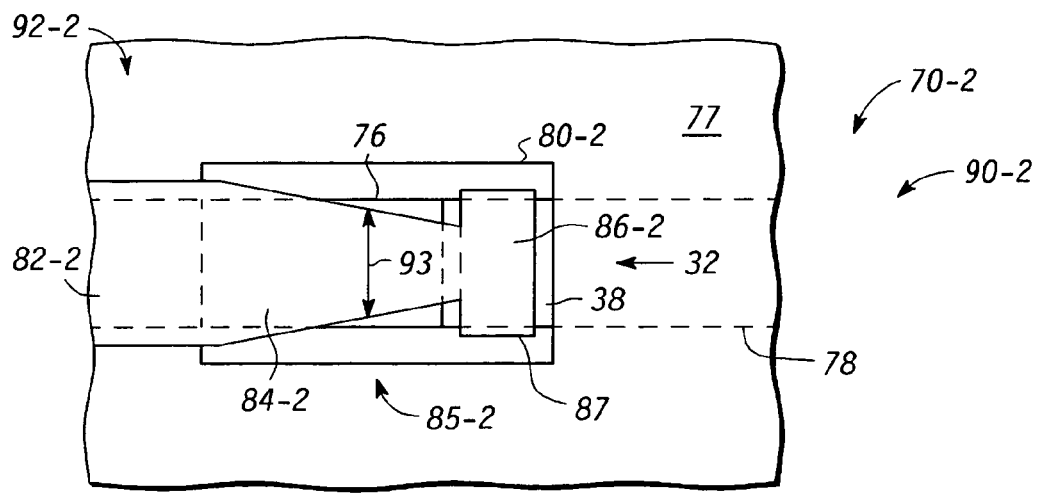
FIG. 10 is a simplified plan view of the magnetic tunnel junction sensor of FIG. 8 wherein a single flexible cantilever beam supports a permanent magnet for providing a varying magnetic field to the magnetic tunnel junction, depending upon the sensor input.

FIG. 10 is simplified plan view 90-2 of magnetic tunnel junction sensor 70-2 corresponding to a further exemplary embodiment of sensor 70 of FIG. 8, wherein cantilevered beam 84-2 having MFS portion 86-2 with permanent magnet 87 thereon provides the varying magnetic field to magnetic tunnel junction 32, in response to changes in the input to sensor 70-2. Such an arrangement is referred to as having a passive magnetic field source, that is, the magnetic field is generated by a permanent magnet rather than a current carrying wire or coil. MTJ 32 is seen in plan view 90-2 with electrode 38 nearest to the viewer. Cantilever beam 84-2 is conveniently a single beam with end region 82-2 anchored on region 92-2 of layer 77 and portions 85-2 and 86-2 extending over recess or opening 80-2 in layer 77. Permanent magnet 87 is provided, attached by any convenient means to MFS portion 86-2 over MTJ 32. Magnet 87 is conveniently but not essentially mounted on the underside of beam 84-2 below portion 86-2, but could also be mounted above or elsewhere on portion 86-2. Magnet 87 produces a magnetic field in the vicinity of MTJ 32, analogous to magnetic field 35 of sensor 20 of FIG. 1. While cantilever beam 84-2 is illustrated in FIG. 10 as having tapering width 93 between anchor region 82-2 and MFS portion 86-2, this is merely for convenience of illustration, and persons of skill in the art will understand that any shape may be used so as to provide the desired deflection characteristics for cantilevered beam 84-2 in the direction of arrows 88.

FIGS. 11-16 illustrate how MTJ 32 may be employed to provide sensors able to detect a variety of physical parameters. FIGS. 11-16 are intended as non-limiting examples, and persons of skill in the art will understand based on the description herein that many other implementations are possible following the basic principals that these and other examples herein teach. For convenience of description, the sensors of FIGS. 11-16 are illustrated as being in discrete, free-standing form rather than part of an integrated circuit that includes the sensing and/or driving circuitry, but that is not precluded. FIGS. 11-16 and the associated discussion are intended merely to facilitate explanation and are not intended to be limiting. Persons of skill in the art will understand based on the description herein that the principals taught in these various examples may be employed in discrete or integrated form.

FIG. 11 is a simplified schematic cross-sectional view through magnetic tunnel junction sensor 100 according to a further exemplary embodiment of the invention. FIG. 12 is a simplified partially cut-away plan view of sensor 100 of FIG. 11. In order to make them easily visible in FIG. 12 and not intended to be limiting, MTJ 32 is assumed to be substantially square in plan view and magnetic field source 104 is assumed to be circular in plan view, but this is merely for convenience of description. Sensor 100 comprises MTJ 32 with leads or conductors 76, 78 mounted in body 101. Referring again to FIG. 11, diaphragm 102 with magnetic field source 104 is located above MTJ 32, wherein MFS 104 ia analogous to source 87 of FIGS. 8 and 10 and source 34 of FIG. 1. Diaphragm 102 with magnetic field source 104 moves as shown by arrows 106 in response to various external stimuli. This has the effect of altering the magnetic field H at MTJ 32, thereby causing its electrical properties to change, as has been explained in connection with FIGS. 1-7. Thus, sensor 100 can detect changes in any physical parameter or function that can alter the relative position of magnetic field source (MFS) 104 and MTJ 32. Non-limiting examples of such physical phenomena are motion, acceleration, force, pressure, temperature, and so forth.

FIG. 13 is a simplified schematic cross-sectional view of sensor 111 similar to that of sensor 100 of FIG. 11 but according to a still further exemplary embodiment of the invention. Sensor 111 differs from sensor 100 by inclusion of attachment lug 105 with attachment hole 107, to facilitate coupling diaphragm 102 with MFS 104 to a remote input, for example, and not intended to be limiting, an object whose position or acceleration is to be monitored or detected, or for coupling to a device whose size or separation changes with temperature, pressure, or other physical parameter.

FIG. 14 is a simplified schematic cross-sectional view of sensor 112 generally like that of FIG. 11 but according to a yet further exemplary embodiment of the invention employing active magnetic field source cantilever beam 108 analogous to magnetic field source cantilever beam 84, 86 of FIGS. 8-9 and source 34 of FIG. 1. FIG. 15 is a simplified partially cut-away plan view of sensor 112 of FIG. 14 showing further details. Mounted between diaphragm 102 and MTJ 32 is cantilevered beam 108 analogous to cantilevered beam 84 of FIGS. 8-9, and with end 110 analogous to magnetic field source 86, located above MTJ 32. Boss or coupling means 109 is conveniently provided on the lower side of diaphragm 102, that is, the side facing toward cantilevered beam 108, to facilitate coupling motion 106 of diaphragm 102 to cantilevered beam 108. A first end of cantilevered beam 108 is anchored in body 101 in region 101-1 and distal end 110 is free to move in a vertical direction in FIG. 14 toward or away from MTJ 32. As can be more readily seen in FIG. 15, cantilevered beam 108 is desirably U-shaped with distal end 110 forming the "bottom" of the "U" located above MTJ 32, analogous to MFS 86 of FIGS. 8-9. Cantilevered beam 108 is adapted to carry current 114 analogous to current 96 of FIG. 9 that produces magnetic field H in the vicinity of MTJ 32 analogous to field 35 of FIG. 1. Changes in the position of diaphragm 102 coupled to cantilevered beam 108 via boss or coupling means 109, changes the magnetic field H at MTJ 32, thereby changing its electrical properties as has been explained in connection with FIGS. 1-7. Thus, the arrangement of FIGS. 14-15 can serve as a sensor for any of the physical parameters already mentioned with the further advantage that by varying driving current 114, the ambient magnetic field H at MTJ 32 may be adjusted so that sensor 112 operates in a most favorable range depending upon whether binary output (e.g., see FIG. 5) or analog output (e.g., see FIG. 7) or a combination thereof (e.g., see FIG. 6) is desired. This is a significant advantage.

FIG. 16 is a simplified schematic cross-sectional view of sensor 116 analogous to sensor 112 of FIG. 14, but according to a still further exemplary embodiment of the invention. Sensor 116 is particularly adapted to measure pressure and/or temperature. Sensor 116 differs from sensor 114 by inclusion of housing 118 with interior chamber 120 above diaphragm 102. When it is desired that sensor 116 function primarily as a pressure sensor, optional I/O port 119 is provided in housing 118 and coupled to the chamber or line or region whose pressure is to be determined. An increase in pressure in chamber 120 causes diaphragm 102 and distal end 110 of cantilevered beam 108 to move toward MTJ 32, thereby increasing the magnetic field H at MTJ 32. When the pressure in chamber 120 drops, the reverse occurs and the magnetic field H at MTJ 32 decreases. The corresponding change in electrical properties in response to the changes in magnetic field H provides an electrical output reflecting the pressure changes. As has been previously explained, this output maybe binary, analog or a mixture of the two.

When it is desired that sensor 116 functions as a temperature sensor, optional I/O port 119 is omitted or sealed, thereby trapping a known quantity of gas within chamber 120. As the temperature of the gas within chamber 120 goes up or down in response to changes in the temperature of housing 118, the pressure of the gas within chamber 120 responds accordingly, diaphragm 102 moves toward or away from MTJ 32 and the electrical properties of MTJ 32 change in the same manner as already described for the case of a pressure sensor. By adjusting the initial gas pressure at the reference temperature and, optionally drive current 114, the reference temperature output from MTJ 32 maybe set to a desired value. Likewise, the dynamic range of sensor 116 may be varied by selecting the spring constants of cantilever beam 108 and diaphragm 102. By proper design of diaphragm 102 and/or cantilever beam 108, the response of sensor 116 may be made linear or non-linear depending upon the desired application. Persons of skill in the art understand how to make cantilever springs or diaphragms with linear or non-linear responses. These are further advantages of the invention. While pressure and temperature sensor 116 of FIG. 16 has been illustrated using a U-shaped, active magnetic field source, this is not intended to be limiting and a passive magnetic field source and single arm cantilevered beam may also be used. It may be desirable to provide temperature stabilization for MTJ 32 so that temperature variations in the properties of MTJ 32 itself are not significant compared to the changes induced by motion of MFS 104 or 110.

Figure 17:
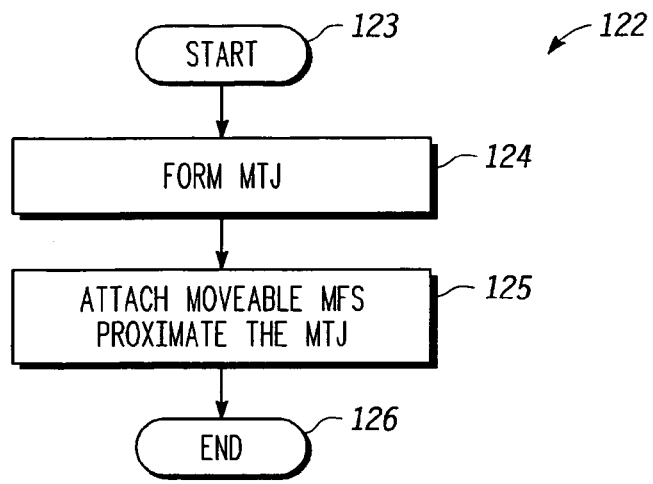
FIG. 17 is a simplified flow diagram of a method of manufacture of the invented sensor.

FIG. 17 is a simplified flow diagram of method of manufacture 122 of the invented sensor. Method 122 begins with START 123 and initial FORM MTJ step 124 wherein a magnetic tunnel junction (MTJ), for example, analogous to MTJ 32 of FIGS. 1 and 8-18 is prepared, with or without conductor 34A of FIG. 1. Persons of skill in the art will understand that the geometry and arrangement of MTJ 32 is merely exemplary and not intended to be limiting. Other MTJ configurations may also be used. In subsequent step 125, a moveable magnetic field source (MFS), as for example MFS 34, 86, 87, 104, 110 illustrated in FIGS. 1 and 8-16, is moveably coupled to MTJ 32, such that the magnetic field at MTJ 32 is modified by motion of the corresponding MFS. Any type of magnetic field source may be used. In the case of sensors of the configuration illustrated in FIGS. 11-16, diaphragm 102 containing MFS 104, 110 is attached above MTJ 32. Method 122 is then generally complete at END 126.

Figure 18:
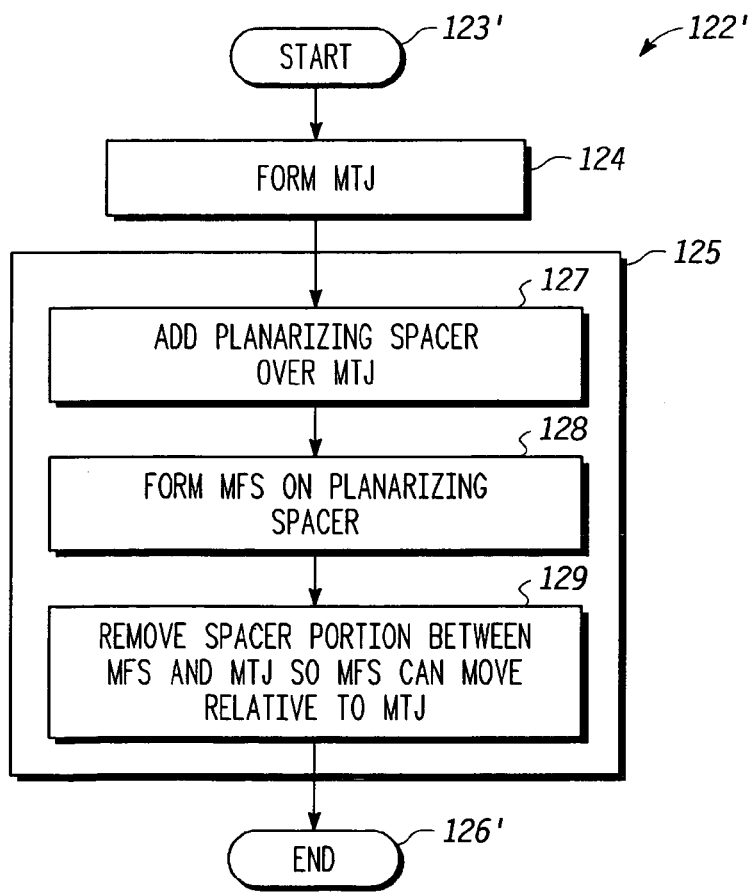
FIG. 18 is a simplified flow diagram analogous to the flow diagram of FIG. 17 but showing further details.

FIG. 18 is a simplified flow diagram of method 122' analogous to method 122 of FIG. 17 but showing further details. START 123' and FORM MTJ step 124 are the same as in method 122. In FIG. 18, step 125 is subdivided into ADD PLANARIZING SPACER OVER MTJ step 127, followed by FORM MFS ON PLANARIZING SPACER step 128, and then step 129 wherein a portion of the planarizing spacer provided in step 128 is removed to form cavity or opening 80 so that the MFS (e.g., MFS 34, 86, 87, 104, 110) can move relative to the MTJ (e.g., MTJ 32) in response to a changing physical parameter desired to be sensed or measured, whereby the movement varies the magnetic field at the MTJ (e.g., MTJ 32). Method 122' is suited to the situation where sensor 30, 70 is being fabricated using integrated circuit technology, but is not limited thereto. Method 122' then proceeds to END 126'.

Figure 19:
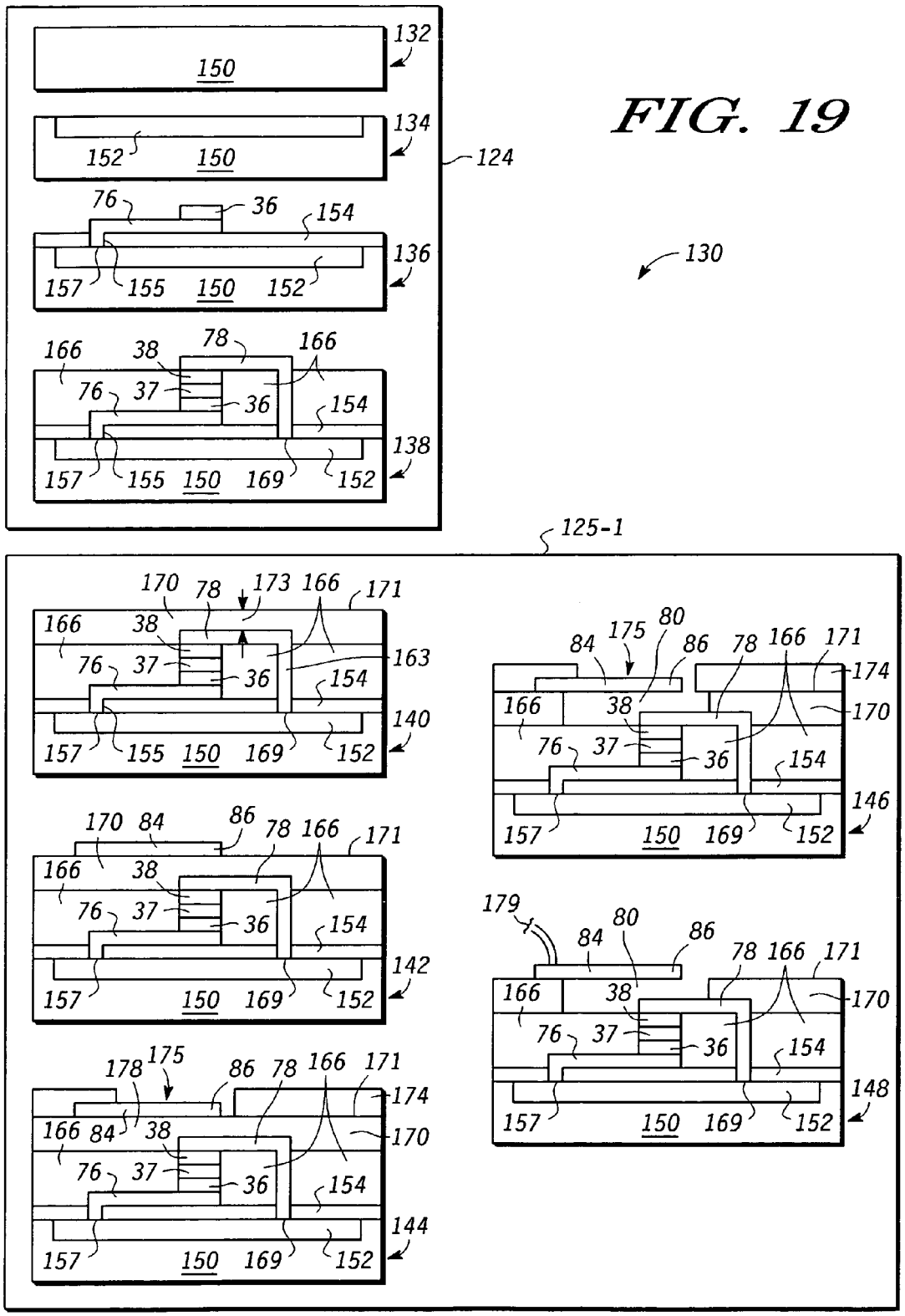
FIG. 19 is a schematic set of cross-sectional views illustrating still further details of an embodiment of the method of FIGS. 17-18.

FIG. 19 is a simplified schematic set of cross-sectional views (hereafter method 130) illustrating by means of steps 132-148 still further details of an embodiment of the method of FIGS. 17-18. Method 130 can be subdivided into steps 132-138 corresponding to step 124 of FIGS. 17-18 and steps 140-148 (collectively 125-1) analogous to steps 125 of FIGS. 17-18. Method 130 is conveniently described for the case wherein MTJ sensor 32 is being fabricated as part of an integrated circuit, but persons of skill in the art will understand how to go about fabricating the sensor as a free-standing element. In initial step 132, substrate 150 is provided, preferably a semiconductor substrate (e.g., Si, GaAs, etc.) suitable for preparation of an integrated circuit. In step 134, transistors and/or other elements are formed using well known semiconductor integrated circuit processing techniques to provide in and/or on substrate 150, measuring and/or driving circuitry 152 for the MTJ sensor and current lead 34A if desired. Persons of skill in the art will understand how to do this. This is not essential for the invention. In step 136, dielectric layer 154 of, for example silicon oxide and/or silicon nitride or other insulating material is grown or deposited and first conductor 76 of, for example aluminum, copper, tantalum, tantalum nitride, titanium, titanium nitride or the like is deposited or formed thereon and patterned to, optionally, make contact in region 157 with the appropriate elements of circuit 152. First electrode 36 of, for example iridium manganese, platinum manganese, cobalt iron, cobalt iron boron, ruthenium, and the like, and combinations of thereof, is deposited on and in electrical contact with conductor 76 and patterned to form first electrode 36 of MTJ 32 (see FIG. 8). The combination of materials chosen should have a relatively high coercive force. It is desirable but not essential that the various semiconductor, dielectric and conductor regions or layers provided up to now, as well as substrate 150, be sufficiently refractory so as to withstand annealing temperatures (e.g., 200 to 350 degrees C.) that can be used to pin spin axes 40 in electrode 36 in a predetermined orientation. However, other means for pinning spin axes 40 may also be used. In step 138, tunneling dielectric 37 of, for example aluminum oxide or magnesium oxide is grown or deposited on electrode 36 and conductive electrode 38 of, for example, nickel iron, cobalt iron, cobalt iron boron, ruthenium, and/or the like and potentially capped with a conductive material such as tantalum, tantalum nitride, titanium, titanium nitride, and the like is grown or deposited on tunneling dielectric 37. The combination of materials used in electrode 38 should have a lower coercive force than the materials making up electrode 36. Electrode 36, dielectric 37 and electrode 38 form MTJ 32 illustrated in FIGS. 1 and 8. Conductors 76, 78 are conveniently provided to make contact to electrodes 36, 38 respectively. While conductors 76, 78 are shown as contacting the appropriate elements of circuit 152 at locations 157, 169 this is not essential and they may be coupled to the drive electronics in any convenient manner.

First planarization layer 166 of, for example silicon dioxide, silicon nitride, phosphorous doped silicon dioxide, and the like is deposited or grown or otherwise formed over the existing structure so that the upper surface of electrode 38 is exposed. Alternatively, first planarization layer 166 may be deposited and then selectively removed, for example by a chemical mechanical polishing (CMP) process or by a sequence of photolithography and etch, from all or part of the upper surface of electrode 38. Conductor 78 of, for example aluminum, copper, tantalum, tantalum nitride, titanium, titanium nitride, and the like or even combinations of these types of materials is then deposited, grown or otherwise formed thereon to make electrical contact with electrode 38 and optionally with the appropriate elements of circuit 152 at location 169. Sinker 163 extending from conductor 78 to location 169 may be formed at the same time and as a part of conductor 78 or may be formed separately, before or after formation of conductor 78. Either arrangement is useful. However, sinker 163 (and sinker 153 of step 136) is not essential and conductor 78 (and conductor 76) may be routed elsewhere rather than to buried circuit 152. In step 140, second planarization layer 170 of, for example silicon dioxide, silicon nitride, phosphorous doped silicon dioxide, and the like, with upper surface 171 is deposited, grown or otherwise formed over first planarization layer 166 and conductor 78. Thickness 173 of second planarization layer 170 will determine in part the ambient separation of cantilevered beam 84 and MTJ 32. Thickness 173 is usefully in the range 0.1 to 1.0 microns, conveniently in the range 0.1 to 0.5 microns and preferably in the range 0.2 to 0.4 microns. If permanent magnet 87 is to be mounted on the lower face of cantilever beam 84 facing MTJ 32, then its thickness needs to be taken into account.

The material desired for beam 84 is then grown or deposited or otherwise formed on surface 171 in the appropriate location so that MFS region 86, 110 (see FIGS. 8-12) will be located over MTJ 32 and anchor region 82 (see FIGS. 8-12) located on layer 170 spaced apart therefrom by the desired beam length. A wide variety of materials, either pure or alloys or composites or layered structures may be used for the material of beam 84. Cu, Al, Au, Ti, W, poly-Si and various mixtures and alloys thereof are non-limiting examples of suitable materials but other materials can also be used. Such materials are conveniently but not essentially formed or deposited by sputtering, co-sputtering, evaporation, electroplating, electrode-less plating or chemical vapor deposition or combinations thereof may be used. Sputtering and co-sputtering, perhaps in combination with electroplating, are preferred, but other materials and processes may also be used. What is important is that beam 84 has a size and stiffness appropriate for the desired application. Persons of skill in the art will understand based on the description herein, how to design and fabricate cantilevered beams of the desired properties for their applications. Exemplary beam structures of the type illustrated in FIG. 9 were fabricated using Cu with a beam thickness in the range of about 0.3 to 1.0 microns and U-shaped arm widths of about 100 microns and with MFS region 86 (see FIGS. 8-10) of about 5 microns width.

In step 144, additional masking layer 174 of, for example silicon dioxide or silicon nitride, is conveniently grown or deposited or otherwise formed over second planarization layer 170 and still supported beam 84. Hole or opening 175 is provided therein using means well known in the art, as for example, using a sequence of photolithography and etch. What will be portion 82 of cantilevered beam 84 (see FIGS. 8-12) is left covered by masking layer 174. Hole or opening 175 otherwise extends slightly beyond the periphery of the remainder of beam 84 so that in method step 146, portion 178 of planarization layer 170 underlying opening 175 can be removed, e.g., by for example, a wet etch process, thereby creating cavity or recess 80 in its place. It will be recognized by those skilled in the art that better control of this process is achieved if an etch stop layer (not shown) is provided both vertically along the inside walls of the cavity 80 as well as along the bottom of cavity 80 prior to its formation. Beam 84 is now free except for the portion (e.g., portion 82 of FIG. 8) anchored to a portion (e.g., portion 92 of FIG. 8) of planarization layer 170 (e.g., region, 77 of FIG. 8). In method step 148, the remains of masking layer 174 are (desirably but not essentially) removed and, optionally, lead(s) 179 for supplying current 96 (see FIGS. 8-9) are bonded or otherwise coupled to portions 82 of beam 84. If the configuration of FIG. 11 is used with passive MFS 87, then lead(s) 179 are not needed.

Figure 20:
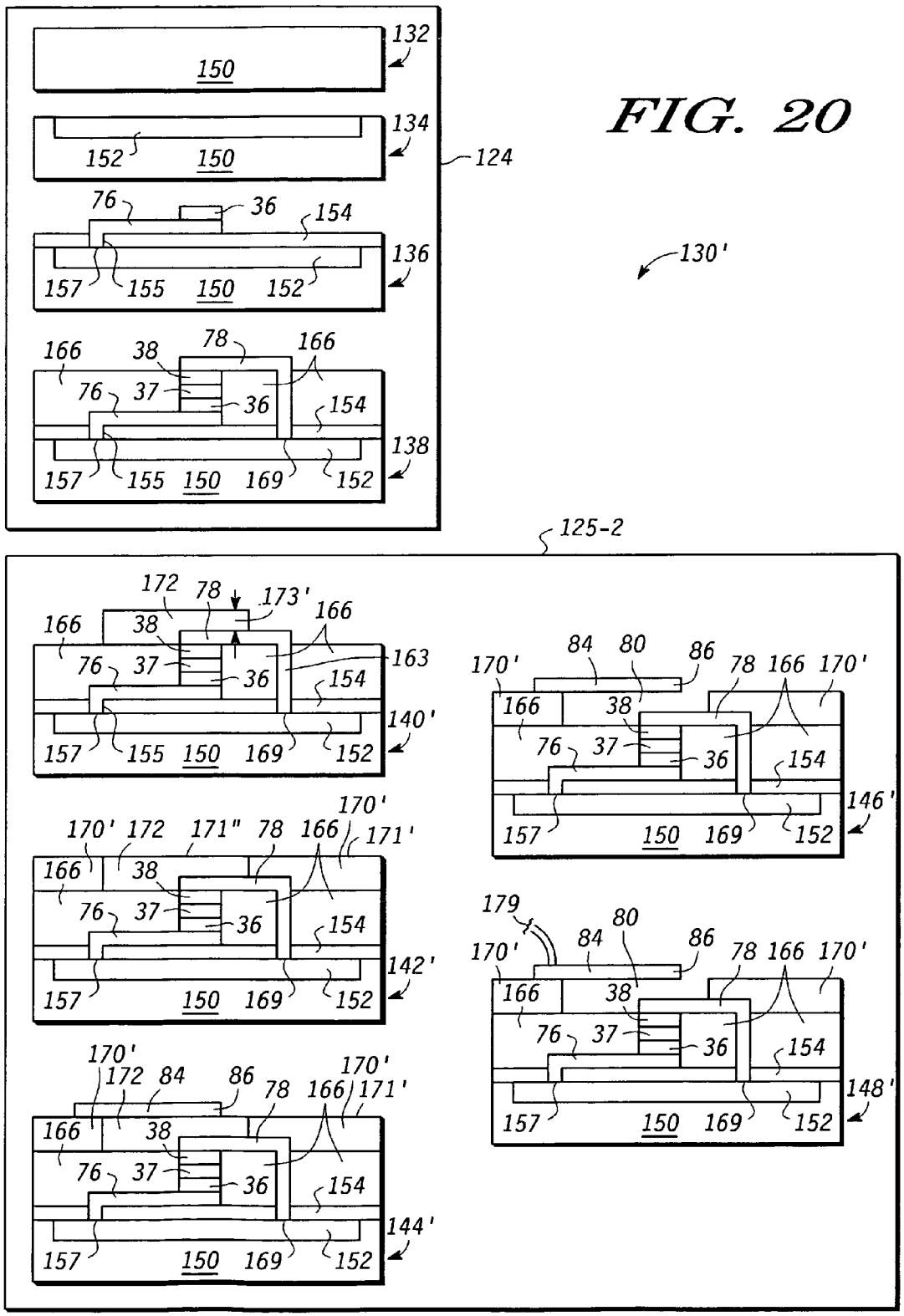
FIG. 20 is a schematic set of cross-sectional views analogous to those of FIG. 19 but according to a further exemplary embodiment of the method of the invention.

FIG. 20 is a simplified schematic set of cross-sectional views 132-138, 140'-148' (collectively method 130'), analogous to steps 132-148 of method 130 of FIG. 19 but according to a further exemplary embodiment of the method of the invention. Method 130' can be subdivided into steps 132-138 corresponding to step 124 of FIGS. 17-18 and steps 140'-148' (collectively 125-2) analogous to steps 125 of FIGS. 17-18. The same reference numerals are used in FIGS. 19-20 to identify like regions or layers and where the regions or layers are not necessarily identical but are analogous, they are identified by using the same reference number with a prime (') added. For example, step 140' in FIG. 20 is analogous to step 140 in FIG. 19, surface 171' in FIG. 20 is analogous to surface 171 in FIG. 19, and so forth. Because of the significant commonality between methods 130, 130', the discussion of method 130 is incorporated herein by reference and only the significant differences explained here. Steps 132-138 of method 130' are substantially the same as in method 130 and are not further described here. Steps 140'-148' differ in some respects. In step 140', sacrificial region 172 of, for example phosphorous doped silicon dioxide is deposited and patterned so as to have substantially the same shape, location and thickness 173' as desired for cavity 80 (see FIG. 8) to be provided beneath cantilever beam 84. It is important that region 172 and second planarizing layer 170' be differentially etchable or dissolvable, that is, that region 172 be able to be dissolved away without significantly affecting second planarizing layer 170' or any underlying layers or regions. Second planarizing layer 170' of, for example silicon dioxide or silicon nitride is formed in step 142' so as to have upper surface 171' substantially level with upper surface 171" of sacrificial region 172. This may be achieved, for example, by a sequence of depositing second planarizing layer 170' followed by a CMP step or other planarizing process. In step 144', cantilever beam 84 is then formed in substantially the same manner and of substantially the same materials and shape and size as previously described in method 130. In step 146', sacrificial region 172 is etched away leaving behind cavity or recess 80 beneath cantilever beam 84 corresponding to cavity or recess 80 of FIG. 8. In step 148', leads 179 are optionally attached to beam 84 as previously described in connection with step 148 of method 130. The end result of method 130' is analogous to that obtained by method 130. Method 130' is preferred.

Figure 21:
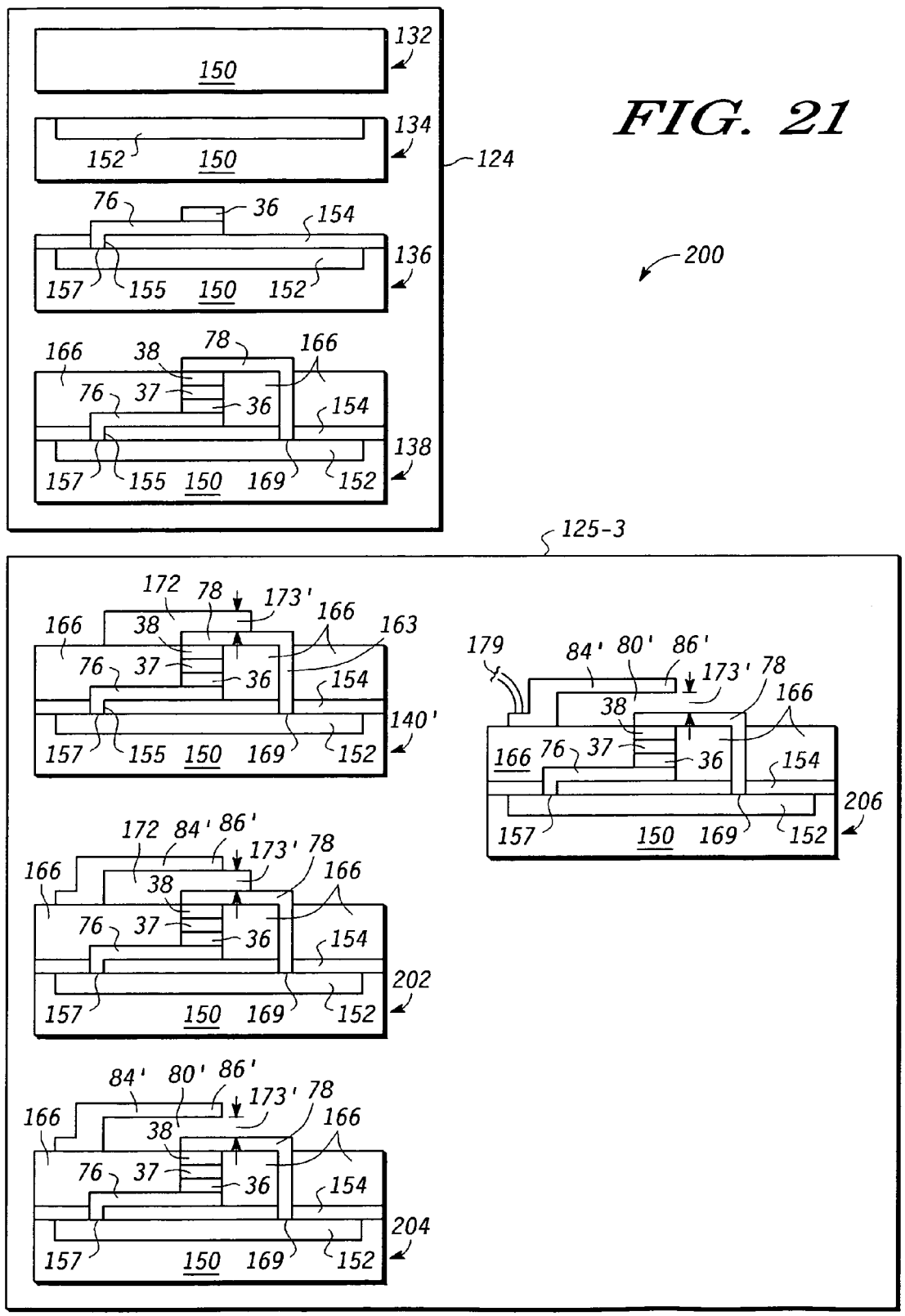
FIG. 21 is a schematic set of cross-sectional views analogous to those of FIGS. 19-20 but according to a still further exemplary embodiment of the method of the invention.

FIG. 21 is a schematic set of cross-sectional views 132-138, 140', 202-206 analogous to those of FIGS. 19-20 but according to still further exemplary embodiment 200 of the method of the invention. Method 200 can be subdivided into steps 132-138 corresponding to step 124 of FIGS. 17-18 and steps 140', 202-206 (collectively 125-3) analogous to steps 125 of FIGS. 17-18. The same reference numerals are used in FIGS. 19-21 to identify like regions or layers and where the regions or layers are not necessarily identical but are analogous, they same convention is followed as used in connection with method 130' of identifying them by using the same reference number with a prime (') added. Steps 132-138 of method 200 are substantially the same as in methods 130, 130' and are not further described here. Steps 140' and 202-206 differ in some respects. In step 140', sacrificial region 172 is formed and patterned in the same manner as already described in method 130', so as to have substantially the same shape, location and thickness 173' as desired for cavity 80 (see FIG. 8) to be provided beneath cantilever beam 84'. It is important that region 172 and first planarizing layer 166 be differentially etchable or dissolvable, that is, that region 172 be able to be dissolved away without significantly affecting first planarizing layer 166 or electrode 78. In step 202, cantilever beam 84' is then formed in substantially the same manner and of substantially the same materials, as previously described in methods 130, 130'. In step 202, beam 84' is conveniently anchored on planarization layer 166, but this is not essential and a structure employing a second planarization layer similar to what is employed in method 130' could also be used. In step 204, sacrificial region 172 is dissolved or etched away leaving behind cavity or recess 80' beneath cantilever beam 84'. In step 206, leads 179 are optionally attached to beam 84 as previously described in connection with step 148 of method 130. The end result of method 200 is analogous to that obtained by method 130'.

Figure 22:
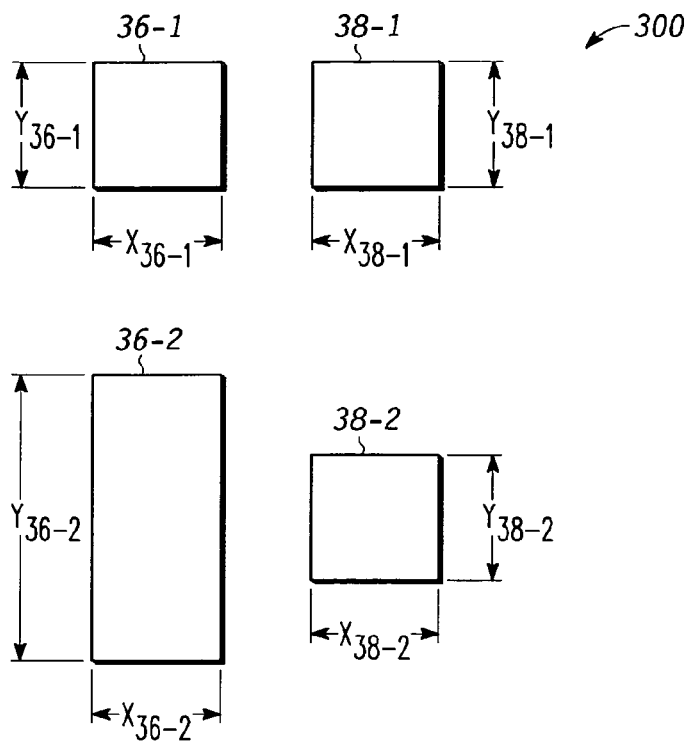
FIG. 22 is an exploded plan view of the electrodes of a MTJ according to an embodiment of the invention where at least one of the electrodes is square.

FIG. 22 shows exploded plan view 300 of electrodes 36, 38 of MTJ 32 according to an embodiment of the invention where at least one of the electrodes is square. Electrodes 36, 38 are laterally displaced in FIG. 23 so that their relative shape and size may be more easily seen. When assembled to form MTJ 32, they lie one above the other, that is, electrode 38 above electrode 36. Electrode 38 is closest to MFS 34, 86. Electrodes 36-1, 38-1 are shown as being substantially square, that is having X and Y dimensions $Y_{36-1}=X_{36-1}=Y_{38-1}=X_{38-1}$. For convenience of explanation, this is the representation that has been used up to now for the most part, but that is not essential. Electrodes 36-2, 38-2 are different with electrode 36-2 being rectangular with $Y_{36-2}>X_{36-2}$ and $Y_{38-2}=X_{38-2}$. Again, this is intended merely to be illustrative of various possible shapes of the electrodes and not to be exhaustive or limiting.

Figure 23:
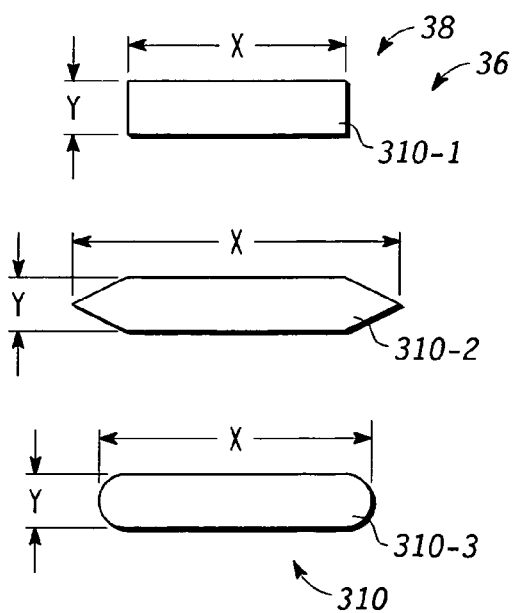
FIG. 23 is an exploded plan view of the electrodes of a MTJ according to embodiments of the invention where either or both electrodes have various exemplary, non-square, shapes.

FIG. 23 shows plan view 310 of electrodes 36, 38 of a MTJ according to embodiments of the invention where either or both electrodes have various exemplary, non-square, shapes. For example, in 310-1, either or both of electrodes 36, 38 are rectangular and elongated with dimension X significantly greater then Y, in 310-2, either or both of electrodes 36, 38 are elongated with X>>Y and with triangular ends, and in 310-3, either or both of electrodes 36, 38 are elongated with X>>Y and with rounded ends. When electrodes are placed one above the other to form MTJ 32, their longer dimensions may make various angles with respect to each other, as is illustrated schematically in FIG. 24. It is useful under certain circumstances to use electrode shapes that are significantly asymmetric since the plan view asymmetry in thin electrodes affects the ease or difficulty with which the electron spin axes may be rotated. For example, while it is known in the art to pin the electron spin axes in the first electrode by heat treatment in the presence of a magnetic field, another approach is to make the electrode shape highly asymmetric, e.g., long and narrow in plan view, since it is very difficult to rotate the electron spin axes away from the long direction of such an asymmetric shape. However, either arrangement for pinning the spin axes may be used.

Figure 24:
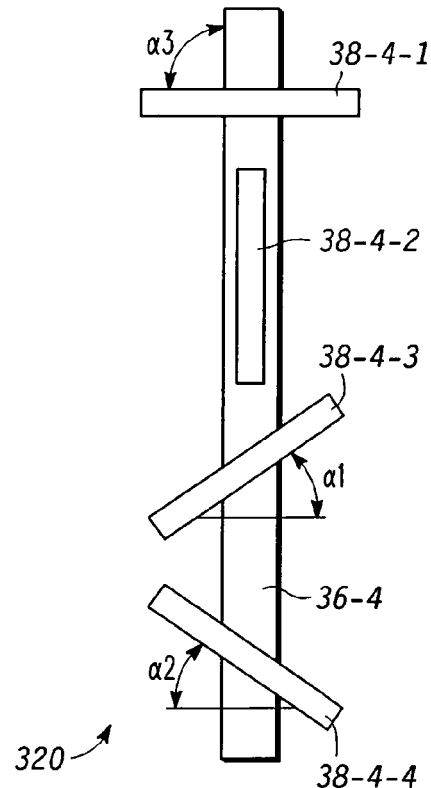
FIG. 24 is a plan view of the electrodes of a MTJ according to embodiments of the invention where at least one of the electrodes has various angular arrangements with respect to the other electrode.

FIG. 24 shows plan view 320 of the electrodes of a MTJ according to embodiments of the invention where at least one of the electrodes 36, 38 has various angular arrangements with respect to the other electrode. For convenience of illustration first electrode 36-4 is shown as a single continuous electrode, with various segmented second electrodes 38-4-1 ... 38-4-4 crossing it at different angles. But this is not intended to be limiting and electrode 36-4 can be composed of separate segments, each underlying a single one of second electrodes 38-4-1 ... 38-4-4. Second electrode 38-4-1 is oriented with its long dimension at angle ($\alpha3$) to electrode 36-4, e.g., substantially orthogonal to the long dimension of first electrode 36-4. Second electrode 38-4-2 is oriented with its long dimension substantially parallel (or anti-parallel) with the long dimension of first electrode 36-4. Second electrode 38-4-3 is oriented with its long dimension at angle ($\alpha1$) and second electrode 38-4-4 is oriented with its long dimension at angle ($\alpha2$) with respect to the long dimension of first electrode 36-4 where $0 \leq \alpha \leq 90$ degrees. Thus, a wide variety of different relative angular orientations may be used for the first and second electrodes 36, 38.

Figure 25:
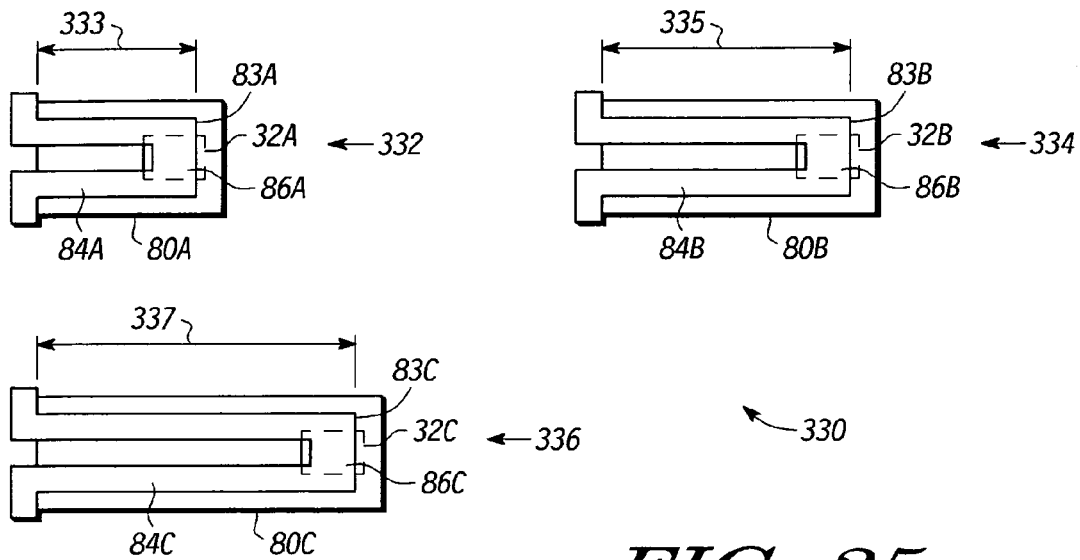
FIG. 25 is a simplified plan view of multiple sensors with cantilever beams of different sizes supporting magnetic field sources in proximity to multiple MTJs.

FIG. 25 shows simplified plan view 330 of multiple cantilever beams 332, 334, 336 of different lengths 333, 335, 337 used to support magnetic field sources 86A, 86B, 86C located in proximity to multiple MTJs 32A, 32B, 32C. By using cantilevered beams of the same cross-section but different lengths (or different cross-sections and similar lengths or of other size and shape variations) the force or acceleration needed to deflect the different beams can be made different. Thus, each beam can be made to respond over a different range of force or acceleration or pressure or temperature or other physical parameter. By combining them in a single sensor, the overall dynamic range of the sensor can be expanded at will. In the example of FIG. 25, the only differences among sensors 332, 334, 336 are beam lengths 333, 335, 337. Such multiple sensors may be manufactured by the same process on the same substrate substantially simultaneously, the different geometry of the individual sensors being provided by mask variations rather than process variations. This is a significant advantage of the present invention.

Figure 26:
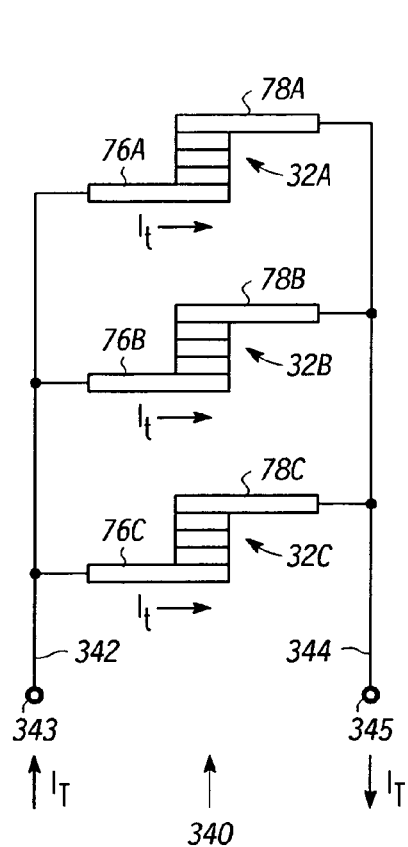
FIG. 26 is a simplified electrical schematic circuit diagram wherein the multiple MTJs of FIG. 25 are illustrated as being electrically coupled in parallel.
Figure 27:
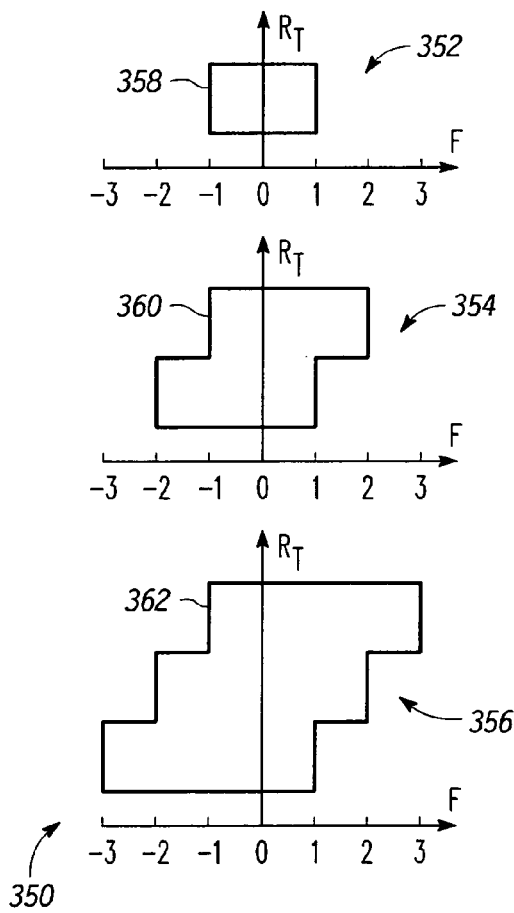
FIG. 27 is a simplified plot of tunneling resistance $R_T$ versus force or acceleration F for the parallel arrangement of FIG. 26, where $R_T$ is the parallel combination of the tunneling resistances through the multiple tunnel junctions and F is the acceleration or force being simultaneously applied to the multiple sensors.

FIG. 26 is a simplified electrical schematic circuit diagram 340 wherein the multiple MTJs 32A, 32B, 32C of FIG. 25 are illustrated as being electrically coupled in parallel by leads 342, 344 leading respectively to terminals 343, 345. FIG. 27 is a simplified plot of $R_T$ versus F for the parallel arrangement of MTJ's 32A, 32B, 32C, where $R_T$ is the parallel combination of the resistances $R_t$ of the individual MTJs 32A, 32B, 32C and F is the acceleration or force being simultaneously applied to cantilevered beams 84A, 84B, 84C of multiple sensors 332, 334, 336. For convenience of explanation it is assumed that MTJs 32A, 32B, 32C have substantially identical $R_t$ vs H characteristics, but that cantilevered beams 84A, 84B, 84C have different stiffness so that for sensor 336, $H=H_c$ occurs at F=1, for sensor 334 $H=H_c$ occurs at F=2 and for sensor 332 $H=H_c$ occurs at F=3 units. In other words, at F=1, beam 84C is fully deflected (against its stop or with region 86-3 touching MTJ 32C), at F=2, beam 84B is fully deflected (against its stop or with region 86-2 against MTJ 32B) and at F=3, beam 84A is fully deflected (against its stop or with region 86A touching MTJ 32A) and that the limit position in each case produces $H_c$ at the associated MTJ. Then for individual $R_t$ vs H characteristics analogous to that shown in FIG. 5, this three beam arrangement gives the $R_T$ vs F response shown schematically in FIG. 27 for plots 352, 354, 356. Trace 358 of plot 352 corresponds to the situation where a force (or acceleration) of F=1 has been applied to sensors 330 and the most easily deflected sensor (e.g., sensor 336) provides $H_c$ to MTJ 32C. Trace 360 of plot 354 corresponds to the situation where a force (or acceleration) of F=2 has been applied to sensors 330 and the next most easily deflected sensor (e.g., sensor 334) provides $H_c$ to MTJ 32B. Trace 362 of plot 356 corresponds to the situation where a force (or acceleration) of F=3 has been applied to sensors 330 and the least easily deflected sensor (e.g., sensor 332) provides $H_c$ to MTJ 32A. In this example, assuming that all of the MTJs are initially in their low resistance state, the total resistance $R_T$ measured in circuit 340 increases in a step-wise fashion as the force or acceleration to which sensors 330 are exposed increases. A current lead (not shown here) analogous to conductor 34A of FIG. 1 is conveniently included with each sensor to provide $-H_c$ to flip the spin axes in electrode 38 back to its initial state as F is removed. Thus, by using multiple sensors having different spring constants and deflection ranges, a wider overall dynamic range can be achieved, either quantized as illustrated in FIG. 27 or analog by using MTJs whose response resembles that of FIG. 6 or 7. While the parallel coupled electrical arrangement illustrated in FIG. 26 is useful, a series arrangement can also be used. Either arrangement works. Being able to easily build sensors having different responses on the same substrate using the same manufacturing process, with only mask differences to change the geometry of individual sensors, is a significant advantage of the present invention. While the use of multiple sensors to extend the dynamic range has been described in terms of cantilevered beam sensors, this is merely for purposes of illustration and not intended to be limiting. Persons of skill in the art will understand based on the description herein that diaphragm type sensors such as are illustrated in FIGS. 11-16 and other physical arrangements combining multiple MTJs and multiple MFSs whose relative positions change in response to the sensor input can also be used.

In a first exemplary embodiment, there is provided a sensor, comprising, a magnetic tunnel junction (MTJ) and a magnetic field source (MFS) moveably coupled to the MTJ and providing a magnetic field at the MTJ that varies in response to an input of the sensor. In a further exemplary embodiment, the MTJ comprises a first electrode having its electron spin axes pinned and a second electrode located closer to the MFS than the first electrode and with its electron spin axes free. In a yet further exemplary embodiment the MTJ further comprises a dielectric separating the first and second electrodes and configured to permit significant tunneling conduction therebetween. In a still further exemplary embodiment, the first electrode is of a first magnetic material having a first coercive force, and the second electrode is of a second magnetic material having a second coercive force smaller than the first coercive force. In a yet still further exemplary embodiment, for a first relative position of the MTJ and the MFS, the spin axes in the first and second electrodes are substantially orthogonal, and for a second relative position of the MTJ and the MSF, the spin axes in the first and second electrodes are not substantially orthogonal. In another exemplary embodiment, for a first relative position of the MTJ and the MFS, the spin axes in the first and second electrodes have a first relative orientation, and for a second relative position of the MTJ and the MSF, the spin axes in the first and second electrodes have a second relative orientation different than the first relative orientation. In a still another exemplary embodiment, the MFS comprises a first conductor adapted to carry current and having a first orientation passing over the MTJ; and the sensor further comprises a second conductor underlying the MTJ and adapted to carry current and having a second orientation substantially orthogonal to the first orientation.

In a second exemplary embodiment, there is provided a sensor comprising, a magnetic tunnel junction (MTJ) having a first magnetic electrode, a second magnetic electrode, and a dielectric separating the first and second electrodes, adapted to provide tunneling conduction therebetween, and wherein the sensor further comprises a magnetic field source (MFS) for providing a magnetic field, moveably suspended in proximity to the second magnetic electrode so that variation of a distance between the MTJ and the MFS in response to an input of the sensor causes the magnetic field of the MFS at the MTJ to vary, thereby altering the electrical properties of the MTJ. In another exemplary embodiment, the MFS is a current carrying conductor. In a yet still another exemplary embodiment, the current carrying conductor is U-shaped. In an additional exemplary embodiment, the MFS is a permanent magnet. In a still additional exemplary embodiment, the sensor further comprises a cantilevered beam from which the MFS is suspended. In a yet still additional exemplary embodiment, the sensor comprises a substrate underlying and supporting the first magnetic electrode, and wherein the MFS is incorporated in a first end of the cantilevered beam spaced apart from the second magnetic electrode, and a second, distal end of the cantilevered beam is coupled to the substrate. Another exemplary embodiment the first magnetic electrode has its electron spin axes oriented in a first direction, the second magnetic electrode has its electron spin axes oriented in a second direction, and for a first relative position of the MFS and MTJ the first and second directions differ by a first angle and for a second relative position of the MFS and MTJ the first and second directions differ by a second angle different from the first angle. In another still exemplary embodiment, for the first relative position or the MFS and MTJ the first and second directions are substantially parallel and for a second relative position the first and second directions are substantially antiparallel. In a another yet exemplary embodiment the first and second magnetic electrodes are elongated, each with a longer dimension, and the longer dimension of the first electrode makes an angle $\alpha$ respect to the longer dimension of the second electrode, where $0 \leq \alpha \leq 90$ degrees.

In a third exemplary embodiment, there is provided a multi-range sensor, comprising, a plurality of magnetic tunnel junctions (MTJs), a plurality of magnetic field sources (MFSs), each associated with one MTJ and providing a magnetic field overlapping the associated MTJ, each MFS receiving the input of the multi-range sensor and whose proximity to the associated MTJ varies in a different way in response to the input of the multi-range sensor common to the plurality of MFSs. In a further exemplary embodiment, there is provided a multiplicity of cantilevered beams, each one supporting one of the multiple MFSs in proximity to the associated MTJ. In a still further exemplary embodiment, the multiplicity of cantilevered beams supporting the MFSs have different deflection characteristics in response to the common input to the multi-range sensor. In a yet further exemplary embodiment, the plurality of MTJs are electrically coupled in series, parallel or a combination thereof.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:
1. A magnetic tunnel junction (MTJ) sensor, comprising:
   an MTJ including a first conductor overlying the MTJ and adapted to carry current and having a first orientation with respect to the MTJ and a second conductor underlying the MTJ and adapted to carry current and having a second orientation substantially orthogonal to the first orientation; and
   a magnetic field source (MFS) moveably coupled to the MTJ and providing a magnetic field at the MTJ that varies in response to movement of the MFS.

2. The MTJ sensor of claim 1, wherein the MTJ comprises:
a first electrode having its electron spin axes pinned; and
a second electrode located closer to the MFS than the first electrode and with its electron spin axes free.

3. The MTJ sensor of claim 2, wherein the MTJ further comprises:
a dielectric separating the first and second electrodes and configured to permit significant tunneling conduction therebetween.

4. The MTJ sensor of claim 3, wherein the first electrode is of a first magnetic material having a first coercive force, and the second electrode is of a second magnetic material having a second coercive force smaller than the first coercive force.

5. The MTJ sensor of claim 3, wherein for a first relative position of the MTJ and the MFS, the spin axes in the first and second electrodes are substantially orthogonal, and for a second relative position of the MTJ and the MSF, the spin axes in the first and second electrodes are not substantially orthogonal.

6. The MTJ sensor of claim 3, wherein for a first relative position of the MTJ and the MFS, the spin axes in the first and second electrodes have a first relative orientation, and for a second relative position of the MTJ and the MSF, the spin axes in the first and second electrodes have a second relative orientation different than the first relative orientation.

7. The MTJ sensor of claim 1, wherein the first and second conductors combined form a U-shape.

8. The MTJ sensor of claim 1, wherein the MFS is a permanent magnet.

9. A magnetic tunnel junction (MTJ) sensor, comprising:
an MTJ including a first magnetic electrode, a second magnetic electrode, and a dielectric separating the first and second electrodes, adapted to provide tunneling conduction therebetween: and
a magnetic field source (MFS) moveably coupled to the MTJ and providing a magnetic field at the MTJ that varies in response to movement of the MFS, wherein
the MFS is moveably suspended in proximity to the second magnetic electrode so that variation of a distance between the MTJ and the MFS in response to the input of the sensor causes the magnetic field of the MFS at the MTJ to vary, thereby altering the electrical properties of the MTJ; and further comprising:
a cantilevered beam from which the MFS is suspended;
a substrate underlying and supporting the first magnetic electrode; and
wherein the MFS is incorporated in a first end of the cantilevered beam spaced apart from the second magnetic electrode, and a second, distal end of the cantilevered beam is coupled to the substrate.

10. A magnetic tunnel junction (MTJ) sensor, comprising:
an MTJ including a first magnetic electrode, a second magnetic electrode, and a dielectric separating the first and second electrodes, adapted to provide tunneling conduction therebetween; and
a magnetic field source (MFS) moveably coupled to the MTJ and providing a magnetic field at the MTJ that varies in response to movement of the MFS, wherein
the MFS is moveably suspended in proximity to the second magnetic electrode so that variation of a distance between the MTJ and the MFS in response to the input of the sensor causes the magnetic field of the MFS at the MTJ to vary, thereby altering the electrical properties of the MTJ, and the first magnetic electrode has its electron spin axes oriented in a first direction, the second magnetic electrode has its electron spin axes oriented in a second direction, and for a first relative position of the MFS and MTJ the first and second directions differ by a first angle and for a second relative position of the MFS and MTJ the first and second directions differ by a second angle different from the first angle.

11. The MTJ sensor of claim 10, wherein for the first relative position of the MFS and MTJ the first and second directions are substantially parallel and for a second relative position the first and second directions are substantially anti-parallel.

12. A magnetic tunnel junction (MTJ) sensor, comprising:
an MTJ including a first magnetic electrode, a second magnetic electrode, and a dielectric separating the first and second electrodes, adapted to provide tunneling conduction therebetween; and
a magnetic field source (MES) moveably coupled to the MTJ and providing a magnetic field at the MTJ that varies in response to movement of the MFS, wherein
the MFS is moveably suspended in proximity to the second magnetic electrode so that variation of a distance between the MTJ and the MFS in response to the input of the sensor causes the magnetic field of the MFS at the MTJ to vary, thereby altering the electrical properties of the MTJ, and
the first and second magnetic electrodes are elongated, each with a longer dimension, and the longer dimension of the first electrode makes an angle $\alpha$ respect to the longer dimension of the second electrode, where $0 \leq \alpha \leq 90$ degrees.

13. A magnetic tunnel junction (MTJ) sensor comprising:
one or more magnetic tunnel junctions (MTJs); and
one or more magnetic field sources (MFSs), each MFS moveably coupled to a single MTJ and providing a magnetic field overlapping an associated MTJ, the magnetic field varying in response to movement of the MFS, each MFS receiving the input of the multi-range sensor and whose proximity to the associated MTJ varies in a different way in response to a common input of the multi-range sensor that is common to the MFS and the one or more additional MFSs, wherein the sensor is a multi-range sensor.

14. The MTJ sensor of claims 13, further comprising:
a multiplicity of cantilevered beams, each one supporting one of the MFSs in proximity to the associated MTJ.

15. The MTJ sensor of claim 14, wherein the multiplicity of cantilevered beams supporting the MFSs have different deflection characteristics in response to the common input to the multi-range sensor.

16. The MTJ sensor of claim 15, wherein the MTJs are electrically coupled in series, parallel or a combination thereof.

* * * * *